United States Patent [19]

East et al.

[11] 4,408,164
[45] Oct. 4, 1983

[54] COMPENSATION CIRCUIT FOR RADIATION DETECTORS

[75] Inventors: Phillip C. East, Nepean; Malcolm S. McGowan, Ottawa, both of Canada

[73] Assignee: Her Majesty the Queen in right of Canada, Ottawa, Canada

[21] Appl. No.: 298,373

[22] Filed: Sep. 1, 1981

[30] Foreign Application Priority Data

Sep. 18, 1980 [CA] Canada ................................. 380687

[51] Int. Cl.³ ........................ H03K 5/24; H03K 13/09
[52] U.S. Cl. .................................. 328/117; 250/388; 377/6; 328/147
[58] Field of Search ............... 328/115, 116, 117, 147, 328/146, 149; 377/6; 307/361; 250/388

[56] References Cited

U.S. PATENT DOCUMENTS

| 3,532,977 | 10/1970 | Giordano et al. | 328/117 |
| 3,593,334 | 7/1971 | Bickel | 328/115 |
| 3,743,946 | 7/1973 | Gass et al. | 328/147 |
| 3,745,340 | 7/1973 | Inoue | 250/388 |

Primary Examiner—John S. Heyman
Attorney, Agent, or Firm—Stevens, Davis, Miller & Mosher

[57] ABSTRACT

A compensation circuit for gamma-radiation detectors in which the pulses are sorted into different channels based on their amplitude. Pulse dividers are provided in the lower energy channels reducing the pulse count in these channels by an amount which is a function of the average energy of pulses received by that channel. The adjusted pulse count rates in each channel are then added to give a signal proportional to the dose rate independent of the radiation energy.

4 Claims, 1 Drawing Figure

COMPENSATION CIRCUIT FOR RADIATION DETECTORS

This invention relates to a circuit for use with gamma-radiation detectors and, in particular, to a circuit which provides greater accuracy in measurement of dose rates when using a solid state detector.

A typical solid-state detector uses a narrow, reversed-biased junction in a semiconductor. The semiconductor if of high impurity to provide a wide depletion layer. Incident radiation creates hole-electron pairs which are transformed into a pulse of current by the biasing field. The amplitude of the current pulse is proportional to the radiation energy absorbed in the detector. It is customary to use a charge amplifier, the configuration of an integrating circuit, to minimize the effect of variations in detector capacitance. Solid-state detectors have the advantages of portability, ruggedness and compatibility with digital electronics. The relation between the dose to personnel and the counts from a solid-state detector is a function of the energy of the radiation. Thus a simple measurement of the count rate from solid-state detectors will not give a good measurement of the dose rate if there is a variation in the radiation energy.

On method of dealing with the problem has been to pass the incident radiation through a material such as tin which effectively reduces the response at low energies. Alternatively, to obtain acceptable energy response, limitations are imposed on detector thickness and high-atomic-number semiconductors, such as cadmium telluride, must be avoided. These factors impose limits on the detector sensitivity in addition to the uncertainty introduced by variations in response with gamma energy.

The present invention separates the pulses from the detector into different channels according to pulse amplitude which is a function of the energy of the incident radiation. The pulses in the channel of lowest energy are divided by a certain factor. The pulses in the channel of next higher energy are divided by a different factor and similarly for the channels of still higher energy. The factors chosen depend on the detector used. The output pulses from each of the channels are then added to give a count rate which is an accurate measure of the dose rate.

Specifically, the invention relates to a signal-processing circuit for use with a proportional radiation detector comprising, circuit means defining a plurality of different channels and logic means coupled to pulses from the detector to direct each pulse to one of the channels according to the amplitude of the pulse so that each channel receives a different range of pulse amplitudes. Pulse-dividing means are provided in each channel except the channel receiving pulses in the highest range, each pulse-dividing means reducing the number of pulses at the respective channel output by a factor which is a function of the average amplitude of the pulses received by that channel. Summing means are connected to the output of each channel to provide an output pulse train whereby the count rate of the output pulse train is indicative of the dose rate of radiation incident on the detector.

A specific embodiment of the invention will now be described in conjunction with the accompanying drawing which is a schematic diagram of a compensating circuit.

DESCRIPTION OF THE PREFERRED EMBODIMENT

Figure 1:
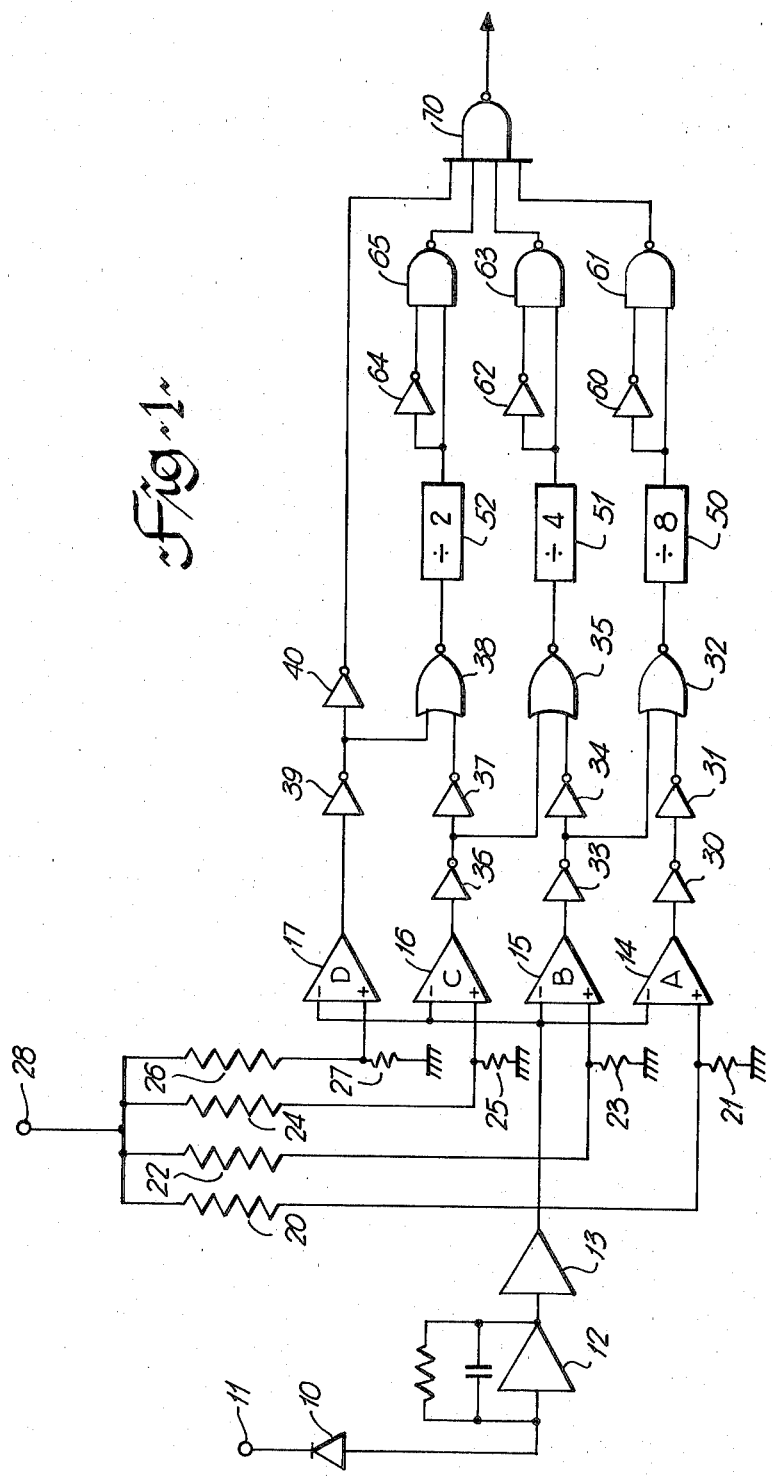

Referring to the drawing, 10 indicates a solid-state radiation detector reverse biased by means of a positive potential applied to terminal 11. When radiation is incident on detector 10, it creates charge carriers which move to the cathode and anode under the influence of the bias voltage to create a pulse of current. This current pulse is supplied to the effective large capacitance appearing at the input of charge amplifier 12 and the output pulse buffered and inverted in amplifier 13. The pulse amplitude is a measure of the energy of the incident radiation.

A series of comparators 14–17 is provided to define separate channels according to the amplitude of the pulse. Each comparator consists of a differential amplifier with the inverting input connected to the output of amplifier 13 and the noninverting input connected to a bias network. Resistors 20,21 form the bias network for comparator 14; resistors 22,23 the bias network for comparator 15; resistors 24,25 the bias network for comparator 16 and resistors 26,27 the bias network for comparator 17. The resistors are connected to an appropriate source of positive potential applied to terminal 28.

Normally, the output of each comparator is quiescent in a high state, as long as the bias network input exceeds the input to the inverting terminal. When the amplitude of the pulse applied to the inverting terminal exceeds the bias voltage, then the comparator is triggered to give a low output. The values of the bias resistors are selected, typically, so that comparator 14 is triggered by pulses which exceed the lowest bias level, which for this example is equivalent to say 50 keV, comparator 15 by pulses which exceed say 65 keV, comparator 16 by pulses which exceed say 150 keV and comparator 17 by pulses which exceed say 300 keV.

The subsequent logic circuitry is intended to ensure that only one of the channels is energized by any pulse. Specifically, in the lower channel in the drawing, designated A, two inverters 30 and 31 are provided in series between comparator 14 and a NOR gate 32. The second channel, designated B, similarly has two inverters 33 and 34 in series between comparator 15 and a NOR gate 35. The second input to NOR gate 32 of channel A is connected between inverters 33 and 34. In the situation where a pulse is of sufficient amplitude to trigger comparator 14 but not comparator 15, then the output of comparator 14 will go low making its associated input to NOR gate 32 low. The output of comparator 15 remains high and is inverted in inverter 33 to make the input to NOR gate 32 also low. The combination of two low inputs to NOR gate 32 gives a high output, which, represents a count in channel A.

Consider now the circumstances when the incident radiation is such to provide a pulse of sufficient amplitude to switch both comparators 14 and 15. In channel A the two inputs to NOR gate 32 are opposite, a low input from comparator 14 and a high input from comparator 15. This results in a low output from NOR gate 32 thus no count being represented in channel A. Channel B is, however, activated in the same manner as discussed in the previous paragraph for channel A, unless the pulse has been of greater amplitude also to trigger comparator 16 in which case the opposite inputs to NOR gate 35 lead to no count being represented in channel B. If comparator 16 itself has been switched but comparator 17 has not, then there will be a count represented in channel C. Finally, if all the comparators 14–17 have been switched then NOR gates A, B and C will have a low output but there will be a count represented in channel D. The count in channel D is represented by a low state at the output of inverter 40. It will be noted that this is opposite to the high state at the output of gates 32, 35 or 38 which has been referred to as identifying a count in channels A, B or C, respectively. Pulse-forming circuits in channels A, B and C, described below, invert the signals in these channels once again to be consistent with the signals in channel D.

Since a count in channel A represents the smallest pulse, containing least energy, these counts are divided by a factor of 8 in divider 50. The counts in channel B, being in the next higher energy range, are divided by a factor of 4 in divider 51 and the counts of channel C are divided by a factor of 2 in divider 52.

Since the output of each divider circuit may remain at a stationary high or low value at the conclusion of the pulse produced by the detector, a pulse forming circuit consisting of inverter 60 and NAND gate 61 is provided in channel A to generate an output pulse on the leading edge of the transition at the output of divider 50. Similarly, inverter 62 and NAND gate 63 provide a pulse output from channel B and inverter 64 and NAND gate 65 provide a pulse output from channel C. These channel outputs together with the output from inverter 40 of channel D are combined in NAND gate 70 providing an output to be supplied to a counter.

It is believed that the operation of the circuit will be clear. When low amplitude pulses are detected they are fed to channel A and only contribute one-eighth to the total output count. Pulses in the range 65–150 keV are passed through channel B and contribute a quarter of their count to the total output count. Pulses in the range 150–300 keV are fed to channel C and contribute half their count to the total output count. Pulses with an energy range in excess of three hundred keV are fed through the system via channel D to the counter.

In addition to its function in the logic circuit, discussed above, inverter 31 provides a delay in channel A which is necessary to compensate for the delayed generation of pulses in channel B. Since the pulse arriving at comparator 15 will have a certain finite rise time it can be seen that comparator 15 will be triggered subsequent to the triggering of comparator 14. The delay provided by inverter circuit 31 compensates for this delayed triggering so that the pulses arriving at NOR gate 32 are in coincidence. A similar effect is provided by inverter 34 to compensate for the delay in triggering comparator 16 and by inverter 37 to compensate for the delay in triggering comparator 17. Thus, there has been described a signal-processing circuit for use with radiation detectors which gives an improved measurement of dose rate. While a particular embodiment has been described, various modifications to the particular logic circuits used will be clear to one skilled in the art.

The embodiments of the invention in which an exclusive property or privilege is claimed are defined as follows:

1. A signal processing circuit for use with a proportional radiation detector comprising: circuit means defining a plurality of different channels; logic means coupled to pulses from said detector to direct said pulse to one of said channels according to the amplitude of said pulse so that each channel receives a different range of pulse amplitudes; pulse-dividing means in each channel except the channel receiving pulses in the highest range, each said pulse-dividing means reducing the number of pulses at the respective channel output by a factor which is a function of the average amplitude of the pulses received by that channel; summing means connected to the output of each channel to provide an output pulse train whereby the count rate of the output pulse train is indicative of the dose rate of radiation incident on the detector.

2. A circuit as set out in claim 1 wherein said logic means includes a comparator in each channel adapted to receive pulses from said detector at one of its inputs, biasing means connected to the other input of each comparator whereby the comparator switches in response to a pulse having an amplitude exceeding the minimum assigned to the channel.

3. A circuit as set out in claim 2 wherein said logic means further includes a NOR gate in each channel, except the channel receiving pulses in the highest range, one input of the NOR gate being coupled to the output of the respective comparator and the other input of the NOR gate being coupled to the output of the comparator of the channel of next higher range via an inverter.

4. A circuit as set out in claim 3 further including pulse-shaping means in each channel having pulse-dividing means and responsive thereto, a NAND gate, the output of each pulse-shaping means and the output of the channel receiving pulses in the highest range being coupled to the inputs of said NAND gate.

* * * * *